(12) United States Patent
Hung

(10) Patent No.: US 7,576,436 B2
(45) Date of Patent: Aug. 18, 2009

(54) STRUCTURE OF WAFER LEVEL PACKAGE WITH AREA BUMP

(75) Inventor: Chih-Pin Hung, Kaoshiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 11/934,793

(22) Filed: Nov. 5, 2007

(65) Prior Publication Data

US 2008/0054460 A1 Mar. 6, 2008

Related U.S. Application Data

(63) Continuation-in-part of application No. 10/904,320, filed on Nov. 3, 2004, now abandoned, which is a continuation-in-part of application No. 10/605,012, filed on Sep. 1, 2003, now Pat. No. 6,825,568.

(30) Foreign Application Priority Data

Dec. 13, 2002 (TW) .............................. 91220267 U

(51) Int. Cl.
*H01L 23/48* (2006.01)
*H01L 23/52* (2006.01)
*H01L 29/40* (2006.01)

(52) U.S. Cl. .................. 257/778; 257/786; 257/780

(58) Field of Classification Search ................ 257/780, 257/781, 778, 784, 786
See application file for complete search history.

(56) References Cited

U.S. PATENT DOCUMENTS

| 6,433,427 | B1 * | 8/2002 | Wu et al. ..................... 257/737 |
| 6,586,844 | B1 * | 7/2003 | Chang ........................ 257/779 |
| 6,838,776 | B2 | 1/2005 | Leal et al. |
| 6,845,554 | B2 | 1/2005 | Frankowsky et al. |
| 2005/0098802 | A1 * | 5/2005 | Kim et al. ................... 257/222 |

* cited by examiner

*Primary Examiner*—S. V Clark
(74) *Attorney, Agent, or Firm*—Jianq Chyun IP Office

(57) ABSTRACT

A package structure with an area bump has at least a chip (also known as a die), a redistribution layer, a plurality of first bumps (normal bumps) and at least a second bump (area bump). The redistribution layer may reroute and integrate the bonding pads of the chip and incorporate the passive components therein.

19 Claims, 11 Drawing Sheets

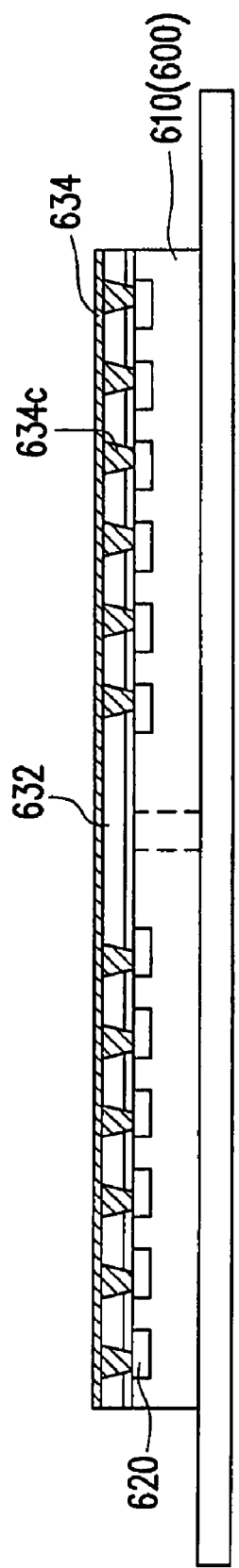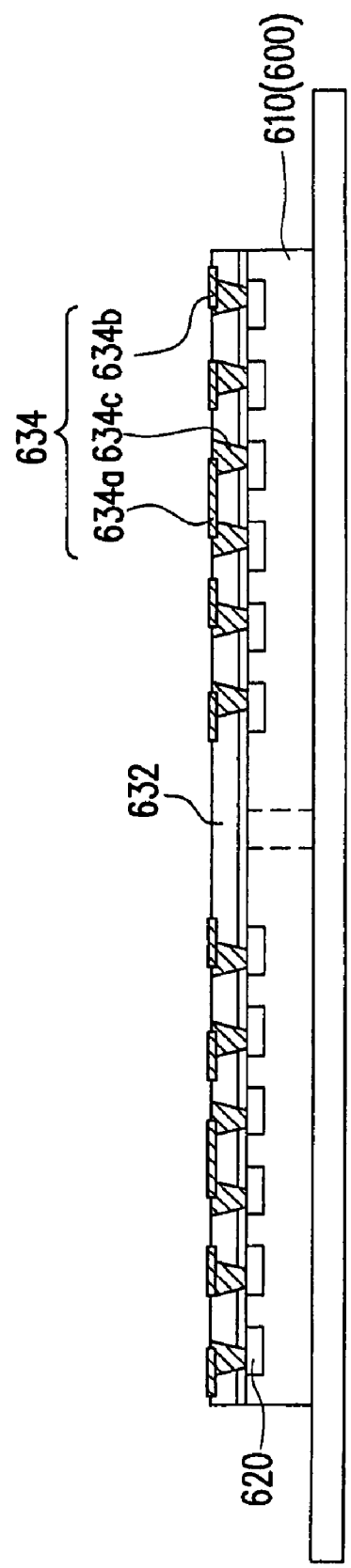

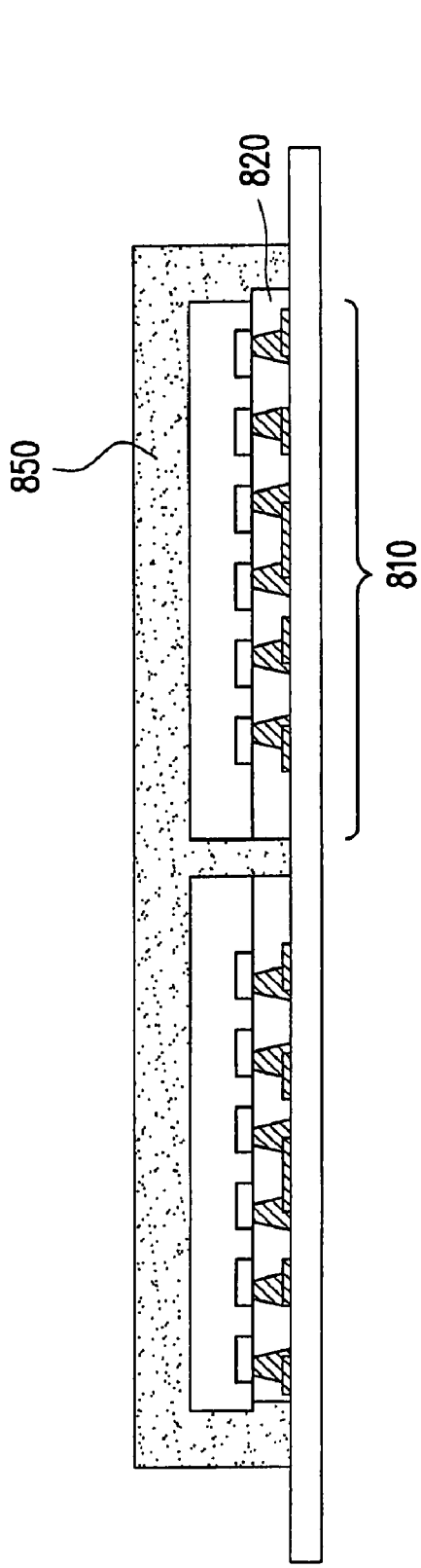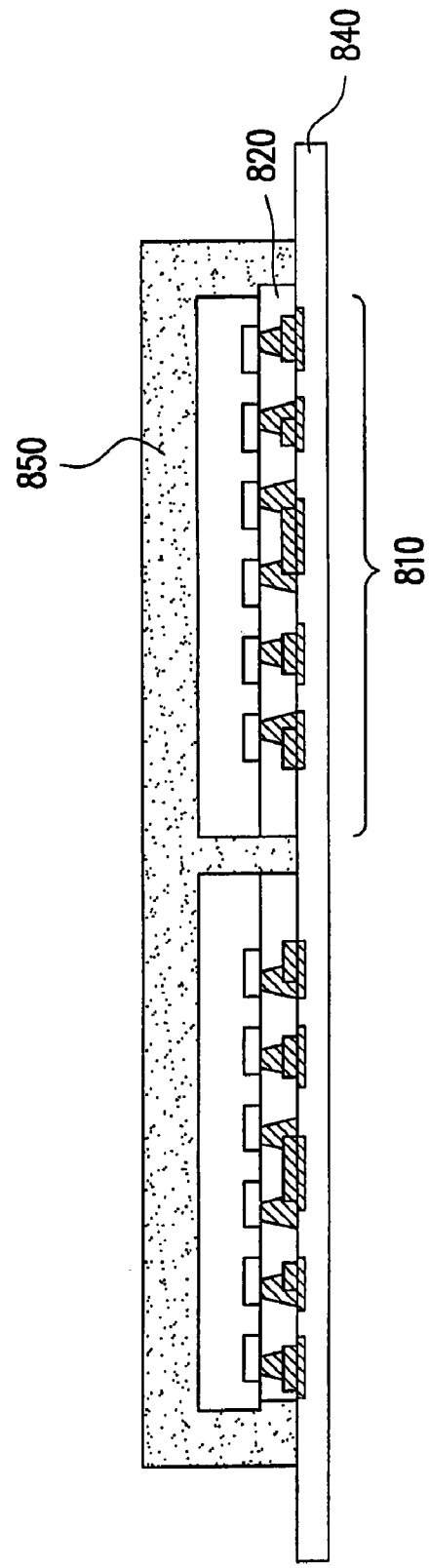

STRUCTURE OF WAFER LEVEL PACKAGE WITH AREA BUMP

CROSS-REFERENCE TO RELATED APPLICATION

This application is a continuation-in-part of a prior application Ser. No. 10/904,320, filed Nov. 3, 2004, which is a continuation-in-part of a prior application Ser. No. 10/605,012, filed Sep. 1, 2003. The prior application Ser. No. 10/605,012 claims the priority benefit of Taiwan application serial no. 91220267, filed on Dec. 13, 2002.

BACKGROUND OF THE INVENTION

1. Field of Invention

The present invention relates to a wafer level package structure, and more particularly, to a wafer level package structure with an area bump.

2. Description of Related Art

The flip chip interconnect technology mainly disposes a plurality of bonding pads (also known as die pads) on an active surface of a chip (also known as a die) by using an area array layout method, and forms a bump on each bonding pad. After the chip is flipped, the bumps on the bonding pads of the chip are respectively electrically and mechanically connected to the contact pads, which correspond to the surface of a substrate or a Printed Circuit Board (PCB). Further, the flip chip interconnect technology also forms the bumps on the contact pads of the surface of the substrate or the PCB first, and electrically and mechanically connected to their corresponding bumps via the bonding pads on the active surface of the chip, respectively. It needs to be noted that since the flip chip interconnect technology can be applied in the high pin count chip package structure and is advantageous in reducing the package area and shorten the signal transmission path, the flip chip interconnect technology has been widely applied in the chip package field currently. The most common used chip package structures applying the flip chip interconnect technology comprise the chip package structures, such as the Flip Chip Ball Grid Array (FC/BGA) and the Flip Chip Pin Grid Array (FC/PGA).

Referring to both FIG. 1 and FIG. 2, FIG. 1 schematically shows a top view of a conventional flip chip package structure, and FIG. 2 schematically shows a sectional view cut from the I-I line in FIG. 1. The flip chip package structure 100 comprises a substrate 110, a chip 130, and a plurality of bumps 140. As shown in FIG. 2, the substrate 110 comprises a substrate surface 112 and a plurality of contact pads 114, wherein the contact pads 114 are disposed on the substrate surface 112 of the substrate 110. Further, the chip 130 comprises an active surface 132, wherein the active surface 132 of the chip 130 roughly means the surface on which the active devices (not shown) are disposed. The chip 130 further comprises a plurality of bonding pads 134, which disposed on the active surface 132 of the chip 130 and used as a media for input/output the signal of chip 130. The contact pads 114 are correspondingly disposed on the bonding pads 134, respectively. Further, the bumps 140 electrically and mechanically connect one of the bonding pads 134 to one of its corresponding contact pads 114, respectively. Finally, an underfill 150 is filled into the cavity surrounded by the substrate 110, the chip 130, and the bumps 140, so as to protect the exposed portion of the contact pads 114, the bonding pads 134, and the bumps 140.

Regarding to the conventional flip chip interconnect technology, the bonding pads of the chip, which provide the functions of signal, power and ground, are electrically and mechanically connected to their corresponding contact pads of the substrate via the same size ball bumps, respectively. It needs to be noted that the electrical performance and the heat dissipation performance are constant for the same size bumps, thus it is hardly achieved the object of improving the electrical performance and the heat dissipation performance by using the same size bumps after the chip is packaged. Therefore, if the designer intends to significantly improve the electrical performance and the heat dissipation performance after the chip is packaged, a new structure has to be developed.

SUMMARY OF THE INVENTION

The present invention provides a wafer-level package structure or a flip chip package structure with an area bump, in which the bump can be designed as any shape in its cross direction based on the special electrical requirement of the chip, so as to improve the electrical performance and the heat dissipation performance after the chip is packaged.

A package structure with an area bump provided by the present invention comprises at least a chip, a redistribution layer, a plurality of first bumps (normal bumps), and at least a second bump (area bump). The chip further comprises a plurality of bonding pads and optionally a passivation layer over the active surface of the chip. The redistribution layer comprises at least a dielectric layer and a patterned metal layer. The patterned metal layer comprises a plurality of first bumping pads, and at least a second bumping pad, wherein the size of the second bumping pad is larger than one of the first bumping pads. The first bump is respectively connected to one of the first bumping pads. Further, the second bump is connected to the second bumping pad, wherein the size of the second bump is larger than one of the first bumps.

In accordance with the preferred embodiment of the present invention, the size of the second bump can be two times (or more) of size of one of the first bumps. Further, the first bumps can be disposed on the periphery of the second bump. The bonding pads may be such as the signal bonding pad, the power bonding pad, or the ground bonding pad, and the bonding pads of similar or same functions can be integrated by the area bumping pad of the redistribution layer.

Therefore, with the wafer-level package structure or the flip chip package structure with an area bump provided by the present invention, multiple pads in the same group originally connected to the power or ground are integrated and connected to an area bump of a larger size through the redistribution layer, so as to increase the electric conductive area and the heat dissipation area for better electrical performance and the heat dissipation performance and provide larger process window for better reliability.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

FIGS. 6A-6F are schematic cross-sectional views of the process steps for fabricating a wafer level package structure according to another preferred embodiment of the present invention.

FIG. 7A is a schematic cross-sectional view of a wafer level package structure according to a third preferred embodiment of the present invention, while

FIGS. 8A-8D' are schematic cross-sectional views showing the molding process for the flip chip package structure.

DESCRIPTION OF THE PREFERRED EMBODIMENTS

Figure 3:
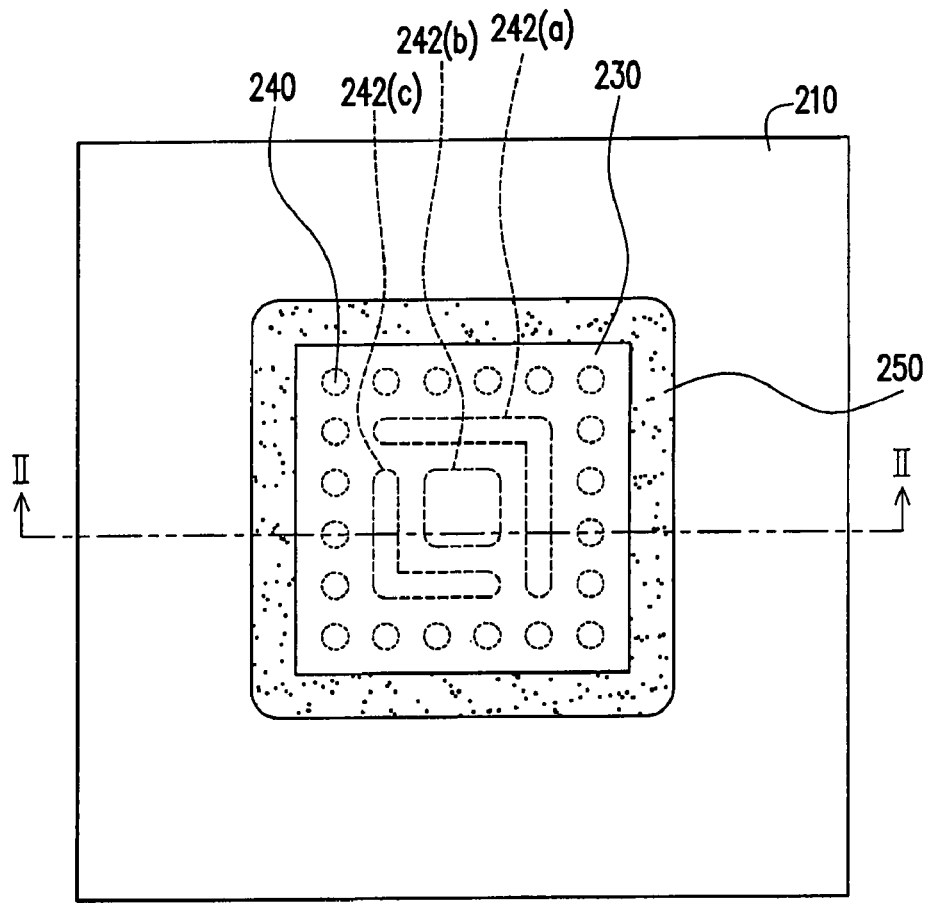
FIG. 3 schematically shows a top view of a flip chip package structure of a first preferred embodiment according to the present invention.
Figure 4:
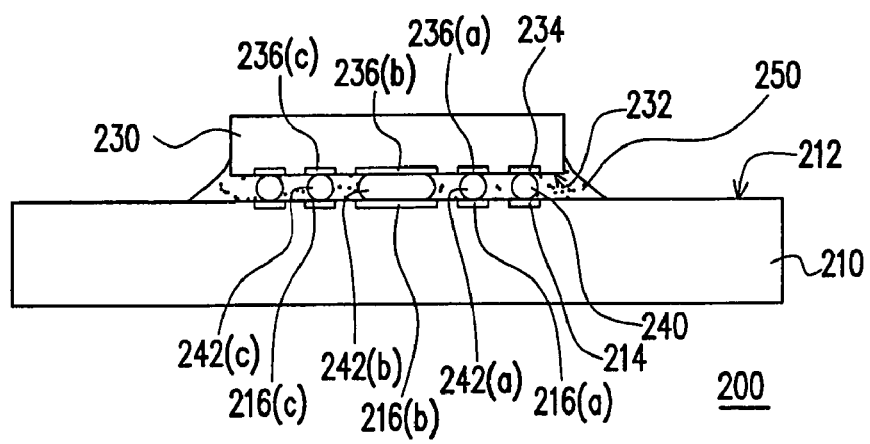
FIG. 4 schematically shows a sectional view cut from the II-II line in FIG. 3.

Referring to both FIG. 3 and FIG. 4, wherein FIG. 3 schematically shows a top view of a flip chip package structure of a first preferred embodiment according to the present invention, and FIG. 4 schematically shows a sectional view cut from the II-II line in FIG. 3. The flip chip package structure 200 comprises a substrate 210, a chip 230, and a plurality of bumps. The bumps comprise a plurality of first bumps and a plurality of second bumps, wherein the first bumps are the normal bumps 240, and the second bumps include at least an area bump 242. As shown in FIG. 4, the substrate 210 comprises a substrate surface 212, a plurality of contact pads 214, and a plurality of area contact pads 216, wherein the contact pads 214 and the area contact pads 216 are disposed on the substrate surface 212 of the substrate 210. Further, the chip 230 comprises an active surface 232, wherein the active surface 232 of the chip 230 roughly means the surface on which the active element (not shown) is disposed. The chip 230 further comprises a plurality of bonding pads 234 and a plurality of area bonding pads 236, wherein the bonding pads 234 and the area bonding pads 236 are disposed on the active surface 232 of the chip 230. Wherein, the positions of the bonding pads 234 and the area bonding pads 236 are respectively corresponding to the positions of the contact pads 214 and the area contact pads 216. Further, the bumps 240 are respectively electrically and mechanically connected to one of the bonding pads 234 and the corresponding one of the contact pads 214, and the area bumps 242 are respectively electrically and mechanically connected to the area bonding pads 236 and its corresponding area contact pads 216.

Referring to FIG. 4, an underfill 250 is filled into the space surrounded by the substrate 210, the chip 230, the bumps 240, and the area bumps 242, so as to protect the exposed portion of the bumps 240 and the area bumps 242, and provide an appropriate elastic buffer between the substrate 210 and the chip 230. Therefore, the bonding pads 234 of the chip 230 are electrically and mechanically connected to the contact pads 214 of the substrate 210 via the bumps 240 respectively, and the area bonding pads 236 of the chip 230 are electrically and mechanically connected to the area contact pads 216 of the substrate 210 via the area bumps 242 respectively.

Referring to FIG. 4, the bonding pads 234 can be used as the media for transmitting the signal of the chip 230 or connecting to the power or the ground, thus the bonding pads 234 may be the signal bonding pads, the power bonding pads or the ground bonding pads. The area bonding pads 236 may be used as the transmission media of the chip 230 for connecting to the power or the ground, thus the area bonding pads 236 may be the power bonding pads or the ground bonding pads.

Wherein, the size of the area bonding pads 236 is larger than that of the bonding pads 234. It needs to be noted that once a larger current conductive area is needed for transmitting a special signal, the area bonding pads 236 also can be used as the transmission media for this special signal, thus being the special signal bonding pads. Further, since the area bumps 242 must provide a larger current conductive area, the size of the area bumps 242 must be larger than that of the bumps 240, and the size of the larger bumps can be more than two times of the size of the smaller bumps. Furthermore, since most of the circuit layout of the chip 230 gathers the power and the ground in the center portion of the chip 230, most of the bumps 240 are disposed on the periphery of the area bumps 242.

Figure 1:
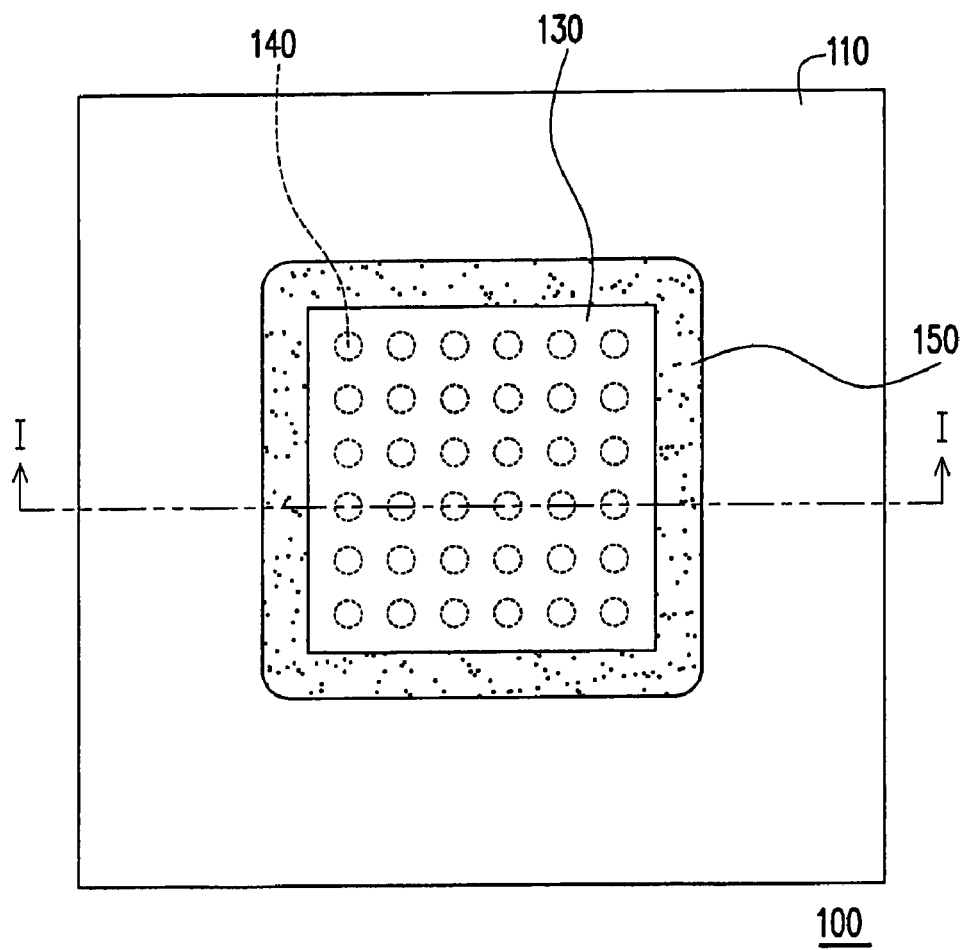
FIG. 1 schematically shows a top view of a conventional flip chip package structure.
Figure 2:
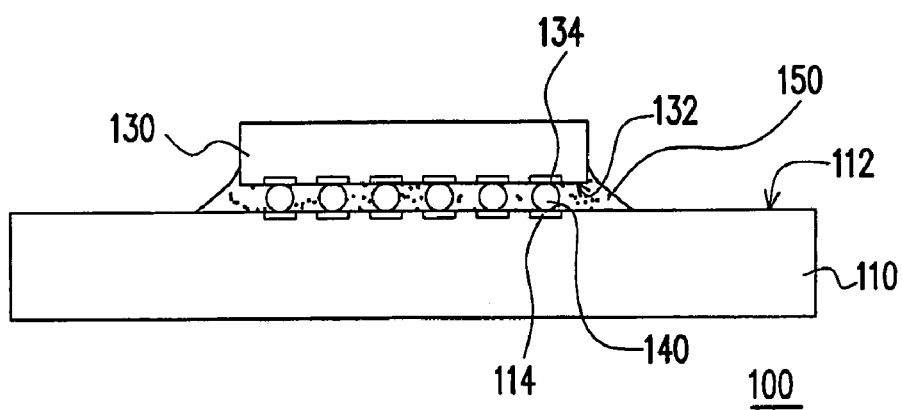
FIG. 2 schematically shows a sectional view cut from the I-I line in FIG. 1.

Referring to FIG. 4, since most of the bonding pads 134 shown in FIG. 2, which are used for connecting to the power or the ground in the prior art, are disposed in a grouping manner on the center portion of the active surface 132 of the chip 134, the horizontal shape of the area bonding pad 236a, 236c may be such as an "L" shape, so as to replace the original layout of the bonding pads, which are used for connecting to the power or the ground in the prior art. The horizontal shape of the area bonding pad 236b may be such as a rectangle, so as to replace the original layout of the bonding pads, which are used for connecting to the power or the ground in the prior art. Therefore, the horizontal shape of the area bumps 242 is corresponded to the horizontal shape of the area bonding pads 236, such as an "L" shape or a rectangle shape, or even other shapes. Furthermore, the size of the area contact pads 216 is larger than one of the contact pads 214, and the contact pads 214 are correspondingly disposed on the periphery of the area contact pads 216. The horizontal shape of the area contact pad 216a, 216c may be such as an "L" shape, and the horizontal shape of the area contact pad 216b may be such as a rectangle. Based on the descriptions above, the area bonding pads 236 and its corresponding area contact pads 216 may have the same horizontal shape and different size.

Referring to FIG. 4, if the area bonding pads 236 are the power bonding pads or the ground bonding pads, since the size of the area bonding pads 236 is larger, and the size of its corresponding area bumps 242 and the corresponding area contact pads 216 are relatively larger, thus it can provide a bigger current conductive area, so as to improve the electrical performance of the chip 230 after it is packaged. Further, since the size of the area contact pads 216 is larger, the heat conductive area of the area contact pads 216 is also increased, so as to improve the heat dissipation performance of the chip 230 after it is packaged.

However, it will be apparent to one of ordinary skill in the art that the area bonding pad of the chip is not necessarily limited to the power bonding pad or the ground bonding pad. For the special signal, which needs a larger current conductive area, the area bonding pad of the chip according to the present invention may be used as a special signal bonding pad mentioned above, so as to fulfill the electrical requirement when the chip is being designed. Therefore, the area bonding pad may be a power bonding pad, a ground bonding pad, or a special signal bonding pad.

Figure 5:
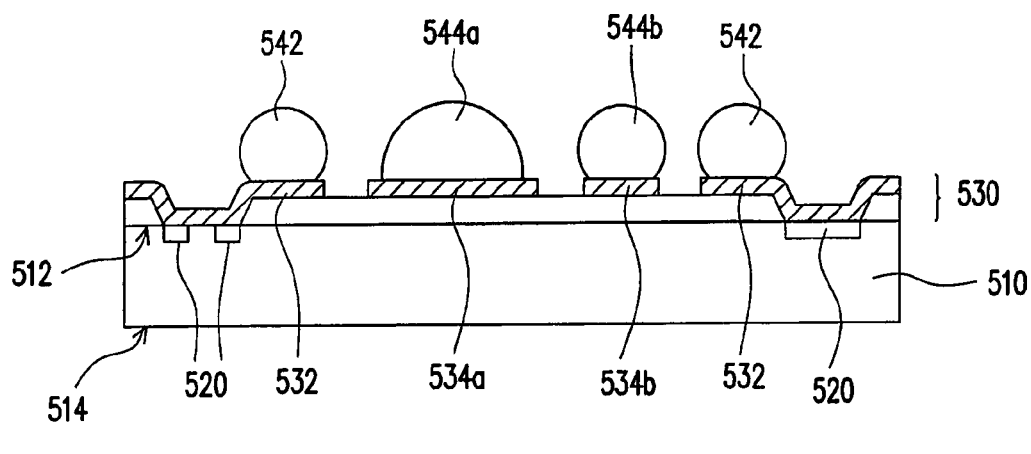
FIG. 5 schematically shows a cross-sectional view of a wafer level package structure of a second preferred embodiment according to the present invention.

Moreover, the above structure is not limited to the flip chip package structure, and can be applied for a wafer level package structure. FIG. 5 schematically shows a cross-sectional view of a wafer level package structure of another preferred embodiment according to the present invention. The wafer level package structure 500 comprises a chip 510 having a plurality of bonding pads 520, and a plurality of bumps. Optionally, a redistribution layer 530 is included in the wafer level package structure 500. Whether the redistribution layer is required depends on the chip (or device) size, the number of bonding pads, and the desired pitch.

The chip 510 comprises an active surface 512 and a back surface 514, while the bonding pads 520 are disposed on the active surface 512 of the chip 510. The bumps comprise a plurality of first bumps and at least one (or more) second bump. The size of the second bump is larger than that of the first bumps. In this embodiment, the first bumps are the normal bumps 542, and the second bumps are area bumps 544.

In this embodiment, the redistribution layer 530 is applied. The redistribution layer 530 reroutes the underlying bonding pads 520 of the chip 510. The redistribution layer 530 comprises a plurality of bumping pads 532 and area bumping pads 534. Furthermore, the size of the area bumping pads 534 is larger than that of the bumping pads 532, and the bumping pads 532 are correspondingly disposed on the periphery of the area bumping pads 534. The positions of the bumping pads 532 and the area bumping pads 534 can be respectively corresponding to the positions of the bonding pads 520, in a one-to-one fashion or one-to-many fashion (i.e. one bumping pad to more than one bonding pads).

The bumps 542 are respectively electrically and mechanically connected to the bumping pads 532, thus being electrically connected to the corresponding bonding pads 520. The area bump 544 is electrically and mechanically connected to the area bumping pads 534 and thus electrically connected to the corresponding bonding pad 520.

The area bumps 544 (including 544a, 544b) can have various shape; for example, the shape of the area bump 544b is as an "L" shape, while the shape of the area bump 544a is a rectangle. However, the shape of the area bump is not limited to the examples described herein, but can be in stripes, round, elliptic, polygonal or other shapes. Similarly, the shapes of the area bumping pads 534 (including 534a, 534b) correspond to the shapes of the area bumps 544, being a rectangle shape or an "L" shape, or even other shapes. Based on the descriptions above, the area bumps 544 and its corresponding area bumping pads 534 may have the same horizontal shape, but in different sizes.

The above wafer level package structure 500 can be connected to a substrate or a PCB board through the bumps. Moreover, the package structure 500 can be further molded with an encapsulant or a molding compound for robustness.

Alternatively, if no redistribution layer is applied to the wafer level package structure, the bumps are formed on the bonding pads and the shapes of the bonding pads may correspond to the shapes of the area bumps.

Figure 6A:
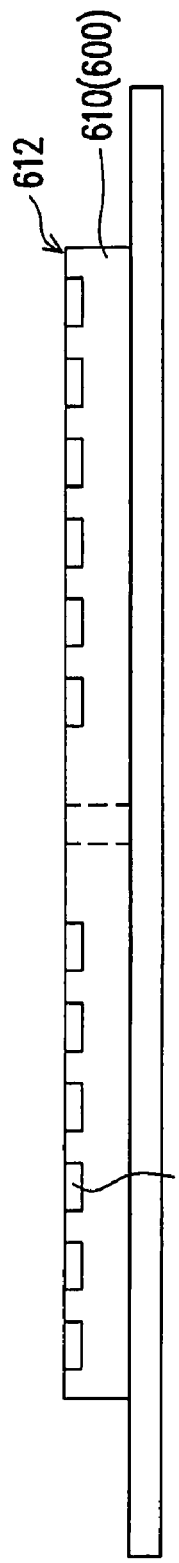

FIGS. 6A-6F are schematic cross-sectional views of the process steps for fabricating a wafer level package structure according to a third preferred embodiment of the present invention. As shown in FIG. 6A, a wafer 600 comprising a plurality of chips 610 is provided, whereas the chip 610 includes a plurality of bonding pads 620.

Figure 6B:
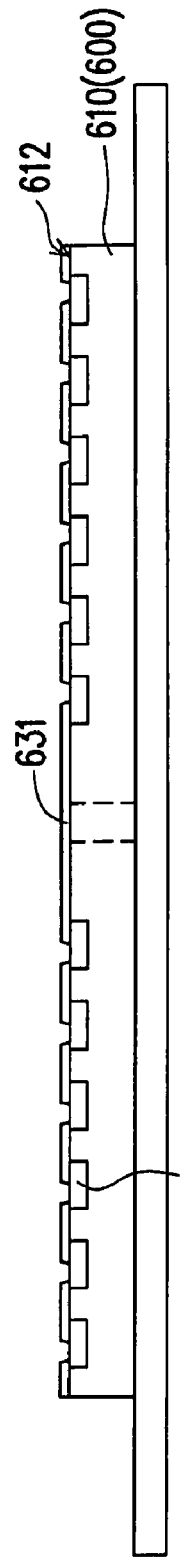

Referring to FIG. 6B, a passivation layer 631 is formed over the wafer and covering the active surface 612 of the chip 610. The passivation layer 631 is made of an organic protective material or inorganic protective material by deposition and the bonding pads 620 are exposed by the passivation layer 631.

Figure 6C:
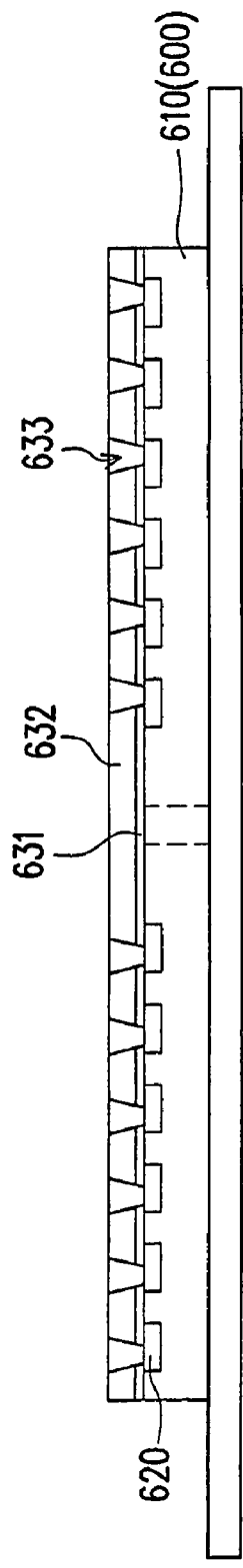

Referring to FIG. 6C, a first dielectric layer 632 is formed on the passivation layer 631, with openings 633 exposing the bonding pads 620. The openings 633 may be formed by laser drilling or photolithography, for example. For example, the material of the first dielectric layer 632 can be macromolecule polymers, such as epoxy resin, polyimide (PI) or benzocyclobutene (BCB).

In FIG. 6D, a first metal layer 634 is formed on the first dielectric layer 632 and filling up the openings 633 to form vias 634c. The first metal layer 634 can be formed by electroplating or sputtering, for example. The metal layer 634 can be a single layer or a stacked layer made of two or more metal layers, and the material of the metal layer 634 can be one or more selected from the group consisting of aluminum, titanium, copper, chromium and nickel, for example.

Referring to FIG. 6E, a photolithography and etching process is performed to pattern the first metal layer 634 so as to form traces 634a and elements 634b.

So far, the redistribution layer 630 includes the first dielectric layer 632 and the patterned metal layer 634.

According to the design of the package, the structure of redistribution layer 630 can be multi-layered structure, and the above steps of FIGS. 6C-6E can be repeated to form multi-layered redistribution layer.

Figure 6F:
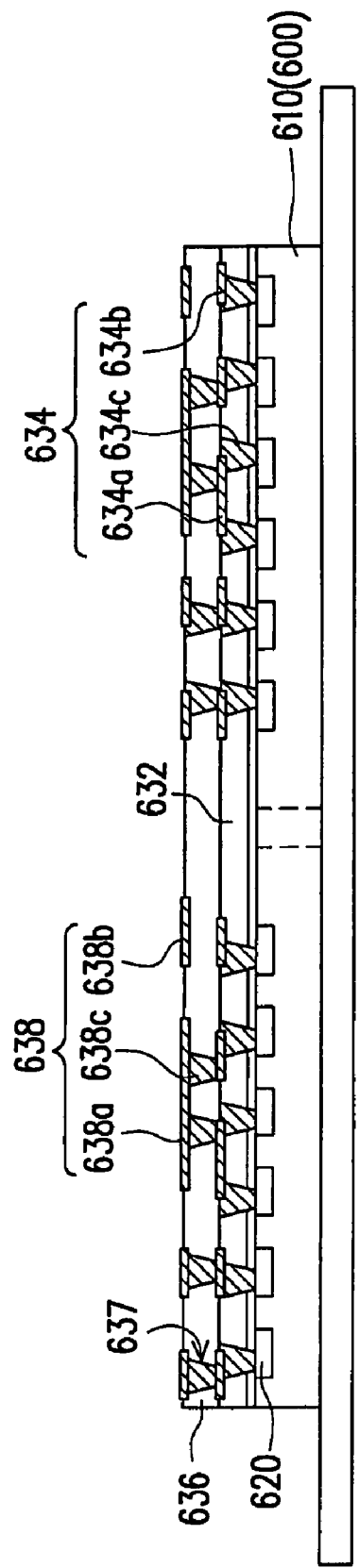

As shown in FIG. 6F, a second dielectric layer 636 is formed over the metal traces/elements 634a/634b and the first dielectric layer 632, and a patterned second metal layer 638 is formed on the second dielectric layer 636 and fills up the openings 637 of the second dielectric layer 636. The material of the second dielectric layer 636 can be high-k dielectric material or macromolecule polymers, for example. The overlying and underlying metal layers 634, 638 are connected by the openings 637 filled by the second metal layer 638. The patterned metal layer 638 includes pads 638a, elements 638b and vias 638c in the openings 637. The patterned metal layer 638 can be formed from a single layer or a stacked layer, and the material of the metal layer 638 can be one or more selected from the group consisting of aluminum, titanium, copper, chromium and nickel, for example.

Thus far, the structure of the redistribution layer 630 includes the first dielectric layer 632, the patterned metal layer 634, the second dielectric layer 636 and the patterned metal layer 638. Depending on the design of the redistribution layer 630, the topmost metal layer can be patterned to form bump pads for further connections and the elements formed from the metal layers may constitute passive components for various functions.

Although the above embodiment describes two or four-layered structures for the redistribution layer, it is comprehensible that the redistribution layer provided by this invention can be fabricated by the thin film multilayer processes and be of more or less than four layers.

Following the formation of the redistribution layer, the bumping process including forming the under-bump-metallurgy (UBM) structure and the bumps on the bumping pads will be performed to complete the wafer level package structure. As the bumping technology is well-known to the artisan in this field, the bumping process will not be described in details herein.

Figure 7A:
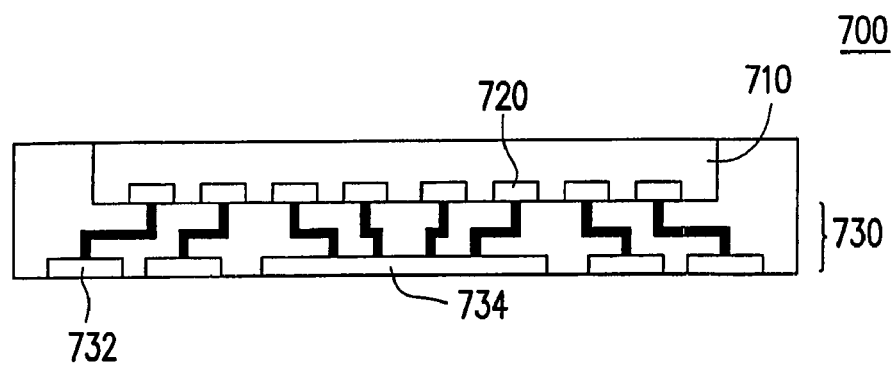
Figure 7B:
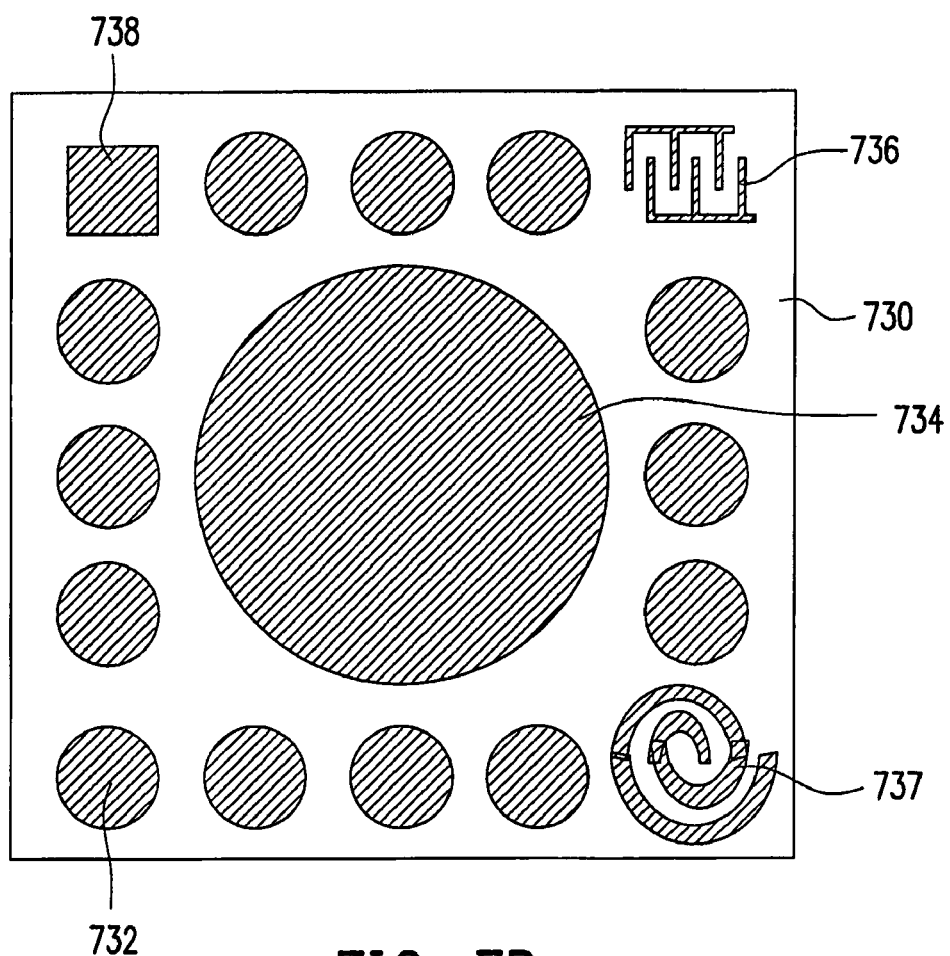
FIG. 7B is a schematic top view of the wafer level package structure.

FIG. 7A is a schematic cross-sectional view of a wafer level package structure according to another preferred embodiment of the present invention, while FIG. 7B is an example of the top view of the wafer level package structure. As shown in FIG. 7A, for the wafer level package structure 700, the redistribution layer 730 reroutes the bonding pads 720 of the chip 710 to bumping pads for further connections. In FIG. 7B, the redistribution layer 730 comprises a plurality of bumping pads 732 and at least one area bumping pad 734. The area bumping pad 734 can be connected to the bonding pads 720 in a one-to-many fashion for integrating or joining the bonding pads 720 of the same or similar functions (i.e. joining together the ground bonding pads, power bonding pads or signal bonding pads). In this case, the size of the area bumping pad 734 is larger than that of the bumping pads 732, and the bumping pads 732 are correspondingly disposed on the periphery of the area bumping pad 734.

Moreover, the redistribution layer 730 may further include passive components and identification marks. Referring to FIG. 7B, the redistribution layer 700 includes a capacitor 736, an inductor 737 and an identification mark (so-called pin 1) 738. By fine-tuning the pattern designs of the metal layers of the redistribution layer, various passive components, including inductors, capacitors and resistors, may be incorporated or fabricated along with the redistribution layer 730. Similarly, during the fabrication of the pads, the pattern of the topmost metal layer can be fine-tuned to incorporate the identification mark.

FIG. 8A-8D' are schematic cross-sectional views showing the molding process for the flip chip package structure according an alternative embodiment of the present invention.

Figure 8A:
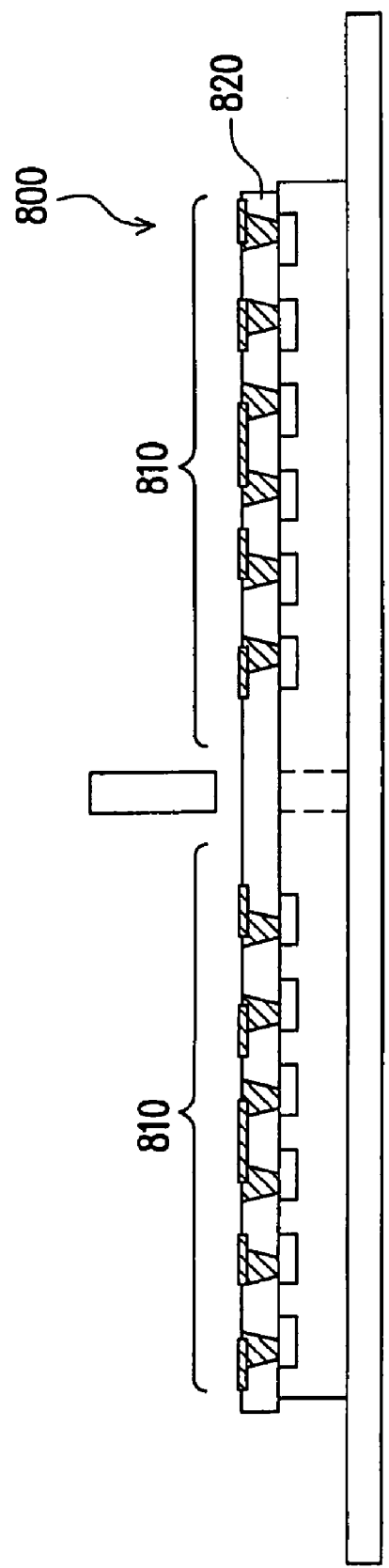

Referring to FIG. 8A, a plurality of dies 810 are obtained by performing a dicing step to the wafer 800 that is formed with the redistribution layer 820.

Figure 8B:
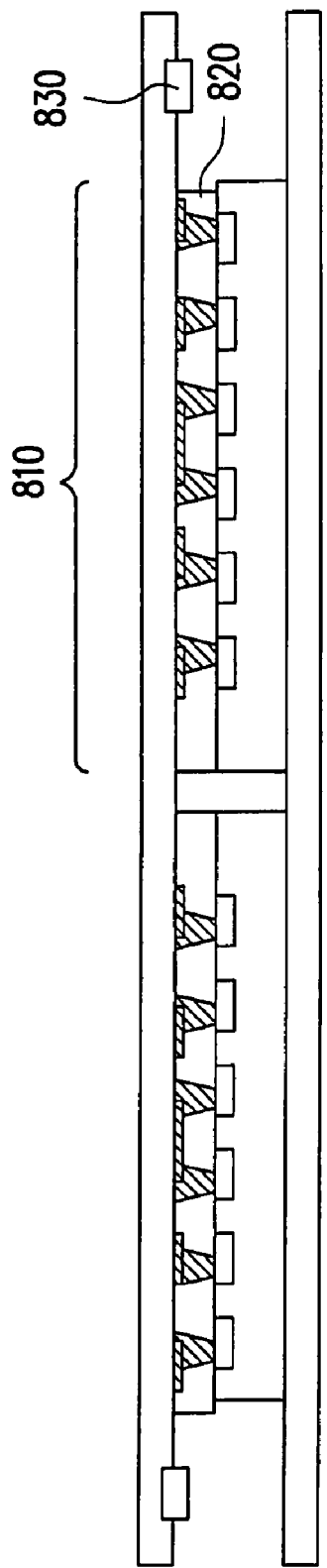
Figure 8B:
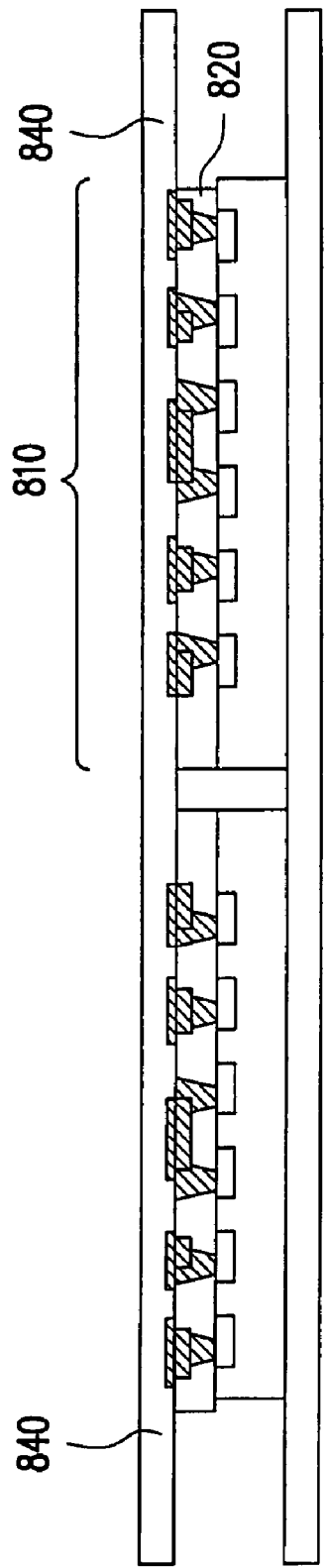

Referring to FIG. 8B, the dies 810 are lined up or picked up by the system with the alignment kit 830 or pick-up arm. During the process, it is reasonable that the good dies are selected and picked up. Next, a molding compound 850 is formed encapsulating the dies 810 with the redistribution layer 820.

Alternatively, the dies 810 having the redistribution layer 820 can be further attached with a preformed circuit pattern or lead-frame 840 for pitch considerations or based on design requirements, as shown in FIG. 8B'. Similarly, following FIG. 8B', the dies 810 with the redistribution layer 820 and the circuit pattern plate 840 are encapsulated by the molding compound 850, as shown in FIG. 8C'.

Figure 8D:
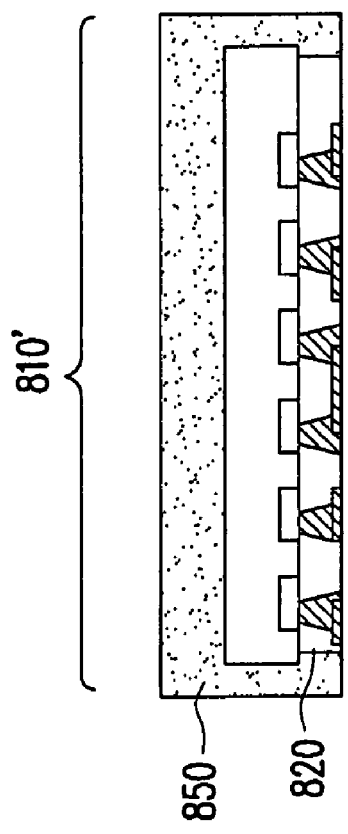
Figure 8D:
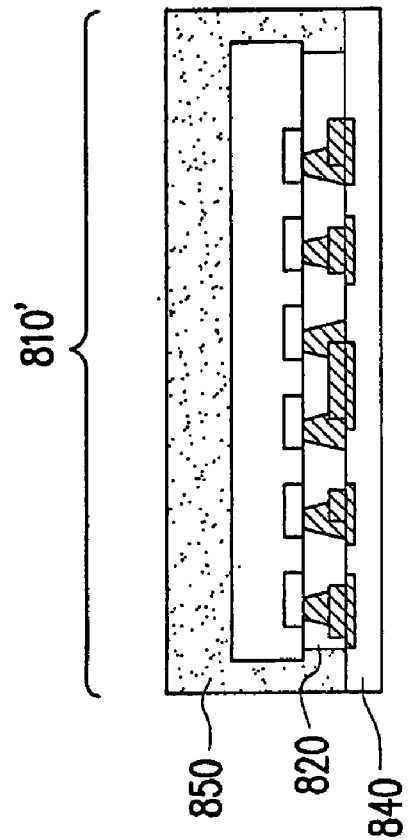

Afterwards, respectively following FIG. 8C or 8C', singulation is performed to separate the molded package structure, so as to obtain single molded dies 810', as shown in FIG. 8D or 8D'.

The molded dies 810' can be furthered formed with bumps thereon, with or without UBM structures, but the detailed processes will not be described herein.

Based on the descriptions above, the package structure provided by the present invention comprises at least a chip having a plurality of bonding pads, a distribution layer having a plurality of bump pads and at least an area bump pad, and a molding compound encapsulating the chip and the redistribution layer. The redistribution layer reroutes the bonding pads of the chip and integrates the bonding pads of similar functions as the area bump pad. It is noted that as the bonding pads of similar functions are integrated as the area bump pad of a larger size (than that of the normal bumping pads), larger process window is provided. Further, the usage of the redistribution layer can promote the design flexibility by rerouting the fine-pitch bonding pads and provide multi-functions by incorporating passive components therein.

In summary, the package structure with an area bump provided by the present invention has following advantages: (1) the bumps of the package structure with an area bump of the present invention can be designed as any shape in its cross direction based on the special electrical requirement of the chip. Therefore, the electrical performance of the chip is improved after it is packaged, and the package structure of the present invention can be used in the electronic product having special electrical requirement. (2) The size of the area bump of the package structure in the present invention is larger when compared to the normal bump. Therefore, the heat dissipation performance of the chip is improved after it is packaged, and the package structure of the present invention can be used in the electronic product having high power consumption. (3) the redistribution layer of the package structure in this invention can reroute the bonding pads of the chip and incorporates passive components therein, thus providing design flexibility and multiple functions for further applications.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A package structure, comprising:
at least a chip, comprising an active surface and a plurality of bonding pads on the active surface;
a passivation layer covering the active surface of the chip and exposing the bonding pads;
a redistribution layer on the passivation layer and over the bonding pads of the chip, wherein the redistribution layer comprises at least a dielectric layer and a patterned metal layer, wherein the patterned metal layer comprises a plurality of first bumping pads and at least a second bumping pad, the first bumping pads are disposed around a periphery of the second bumping pad, and the patterned metal layer is electrically connected to the bonding pads;
a plurality of first bumps, respectively connected to the first bumping pads; and
at least a second bump, connected to the second bumping pad, wherein a size of the second bumping pad is larger than a size of one of the first bumping pads.

2. The structure of claim 1, wherein the redistribution layer further comprises at least one passive component.

3. The structure of claim 2, wherein the passive component is selected from the group consisting of a resistor, a capacitor and an inductor.

4. The structure of claim 1, wherein the first bumping pad is electrically connected to the bonding pads in a one-to-one fashion.

5. The structure of claim 1, wherein the second bumping pad is electrically connected to the bonding pads in a one-to-many fashion.

6. The structure of claim 5, wherein the size of the second bumping pad is about twice the size of one of the first bumping pads.

7. The structure of claim 5, wherein the bonding pads that are connected to the second bumping pad are of the same function.

8. The structure of claim 1, wherein a material of the dielectric layer is selected from the group consisting of epoxy resin, polyimide (PI) and benzocyclobutene (BCB).

9. The structure of claim 1, wherein the patterned metal layer is a stacked layer made of two or more metal layers.

10. The structure of claim 1, wherein the patterned metal layer is made of one or more selected from the group consisting of aluminum, titanium, copper, chromium and nickel.

11. The structure of claim 1, wherein the redistribution layer further comprises a middle metal layer and an inter-dielectric layer sandwiched between the dielectric layer and the patterned metal layer, and the middle metal layer disposed on the dielectric layer is connected to the bonding pads and to the first and second bumping pads through vias.

12. The structure of claim 1, further comprising a molding compound encapsulating the chip and the redistribution layer.

13. The structure of claim 1, further comprising a circuit pattern plate disposed between the redistribution layer and the bumps.

14. The structure of claim 1, further comprising a leadframe disposed between the redistribution layer and the bumps.

15. The structure of claim 1, wherein the bumping pad further comprises at least one identification mark.

16. The structure of claim 15, wherein the shape of the identification mark differs from other bumping pads.

17. The structure of claim 1, wherein the second bumping pad electrically integrates a plurality of power or ground pads.

18. The structure of claim 1, wherein the redistribution layer further comprises a high-k material.

19. A package structure, comprising:
- at least a chip, comprising an active surface and a plurality of bonding pads on the active surface;
- a passivation layer covering the active surface of the chip and exposing the bonding pads;
- a redistribution layer on the passivation layer and over the bonding pads of the chip, wherein the redistribution layer comprises a patterned metal layer electrically connected to the bonding pads and having a plurality of first bumping pads and at least a second bumping pad, and the second bumping pad is electrically connected to the bonding pads in a one-to-many fashion;
- a plurality of first bumps, respectively connected to the first bumping pads; and
- at least a second bump, connected to the second bumping pad, wherein a size of the second bumping pad is larger than a size of one of the first bumping pads.

* * * * *